(12) United States Patent
Yoshida

(10) Patent No.: US 7,408,351 B2
(45) Date of Patent: Aug. 5, 2008

(54) RF COIL AND MAGNETIC RESONANCE IMAGING APPARATUS

(75) Inventor: Masaru Yoshida, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 26 days.

(21) Appl. No.: 11/550,920

(22) Filed: Oct. 19, 2006

(65) Prior Publication Data

US 2007/0114998 A1 May 24, 2007

(30) Foreign Application Priority Data

Oct. 19, 2005 (JP) ............................. 2005-304797

(51) Int. Cl.
*G01V 3/00* (2006.01)
*A61B 5/055* (2006.01)

(52) U.S. Cl. ...................... 324/318; 324/307; 324/309; 600/410; 600/422

(58) Field of Classification Search ......... 324/300–322; 600/410, 411, 422–425; 333/219–230; 335/299
See application file for complete search history.

(56) References Cited

U.S. PATENT DOCUMENTS

| 3,199,021 | A | * | 8/1965 | Anderson | ................. | 324/320 |
| 5,594,337 | A | | 1/1997 | Boskamp | | |
| 5,696,449 | A | | 12/1997 | Boskamp | | |
| 6,348,794 | B1 | | 2/2002 | Nabetani et al. | | |
| 6,590,392 | B2 | | 7/2003 | Boskamp et al. | | |
| 6,624,633 | B1 | | 9/2003 | Zou et al. | | |
| 6,768,303 | B1 | | 7/2004 | Su et al. | | |
| 2002/0149367 | A1 | * | 10/2002 | Boskamp et al. | ............ | 324/318 |
| 2007/0114998 | A1 | * | 5/2007 | Yoshida | ..................... | 324/318 |

OTHER PUBLICATIONS

E.B. Boskamp; Fast Drop Off Cylindrical RF Transmit Coils; Proc. Intl. Soc. Mag. Reson. Med. 10(2002); 1 pg.

* cited by examiner

*Primary Examiner*—Brij Shrivastav
*Assistant Examiner*—Tiffany A Fetzner
(74) *Attorney, Agent, or Firm*—Armstrong Teasdale LLP

(57) ABSTRACT

An RF coil which can restrain coupling while enhancing the freedom of design and arrangement of coils is to be provided. The RF coil unit of a magnetic resonance imaging apparatus is provided with a central coil surrounding a subject around its body axis, an auxiliary coil disposed toward one end of the central coil and having first loop units mutually opposed with the body axis in-between, and another auxiliary coil disposed toward the other end of the central coil and having second loop units mutually opposed with the body axis in-between, wherein one of the first loop unit and one of the second loop unit are arranged to be on mutually reverse sides with respect to the body axis and so connected that the directions of currents resulting from increases in magnetic fluxes in the same direction are in mutually reverse directions.

20 Claims, 5 Drawing Sheets

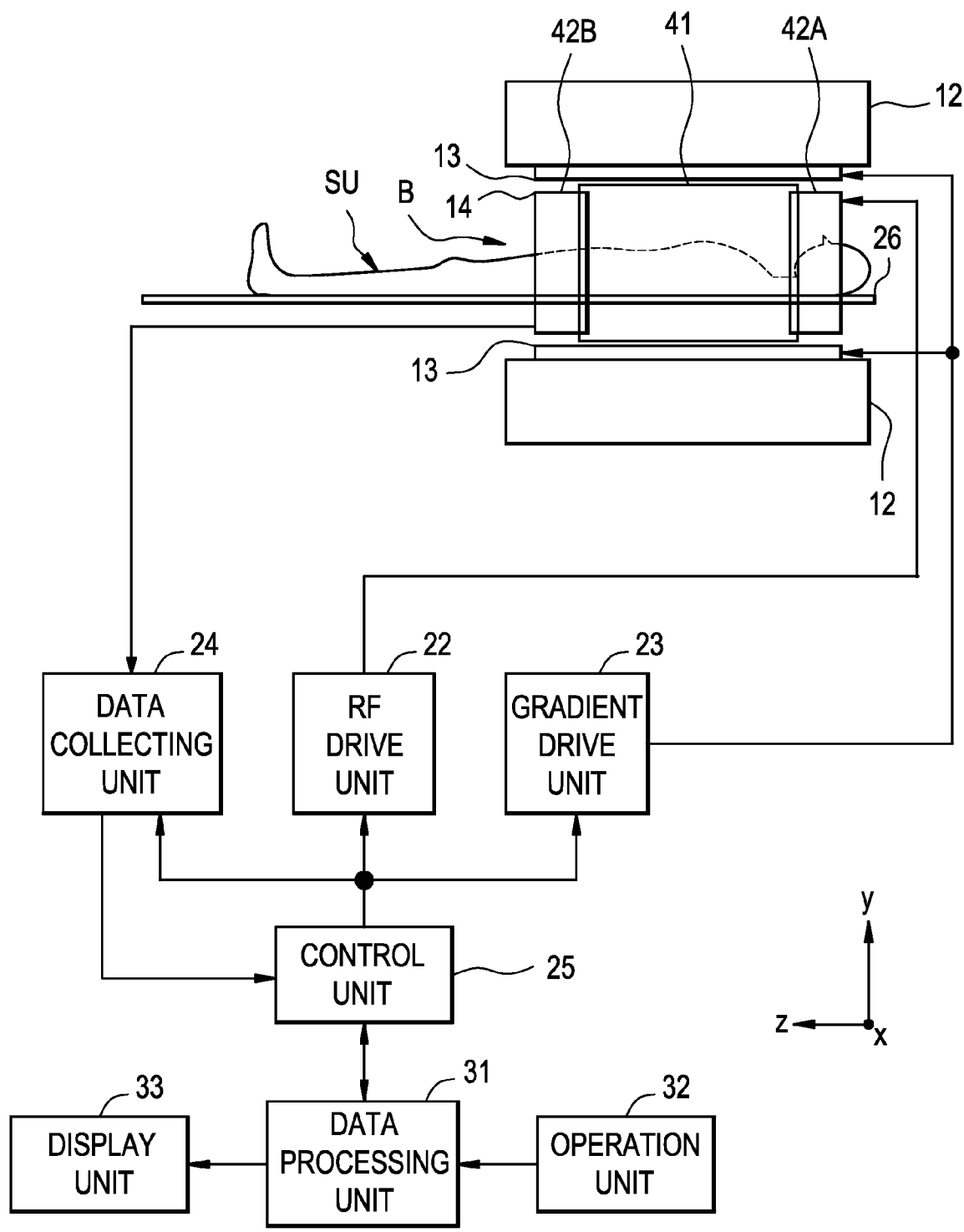

RF COIL AND MAGNETIC RESONANCE IMAGING APPARATUS

CROSS REFERENCE TO RELATED APPLICATIONS

This application claims the benefit of Japanese Application No. 2005-304797 filed Oct. 19, 2005.

BACKGROUND OF THE INVENTION

The present invention relates to an RF coil and a magnetic resonance imaging apparatus.

Some magnetic resonance imaging apparatuses use a plurality of RF coils. Non-patent Document 1, for instance, discloses a technique according to which an auxiliary coil is disposed at both ends of a body coil in the direction of the body axis to improve reception sensitivity on end sides of the body coil. Non-patent Document 1 also suggests the use of decoupling by partly superposing the body coil and the auxiliary coils one over the other.

[Non-patent Document 1] E. B. Boskamp, "Fast drop off cylindrical RF transmit coils", Proc. Intl. Soc. Mag. Reson. Med. 10 (2002), p. 874 of preliminary drafts.

However, the use of decoupling by partly superposing the body coil and the auxiliary coils one over the other not only requires complex calculations for the designing of the shape and size of the auxiliary coils and the arrangement of the auxiliary coils relative to the body coil but also the freedom of design and arrangement of the auxiliary coil is restrained.

SUMMARY OF THE INVENTION

Therefore, an object of the present invention is to provide an RF coil and a magnetic resonance imaging apparatus which can restrain coupling while enhancing the freedom of design and arrangement of coils.

An RF coil according to a first aspect of the invention is provided with a central coil surrounding a subject around a prescribed axis; a first coil disposed toward one end of the central coil in the direction of the axis and having a first loop unit and a second loop unit opposed to each other with the axis in-between; and a second coil disposed toward the other end of the central coil in the direction of the axis and having a third loop unit and a fourth loop unit opposed to each other with the axis in-between, wherein the first loop unit and the third loop unit are arranged on mutually reverse sides with respect to the axis; the second loop unit and the fourth loop unit are arranged on mutually reverse sides with respect to the axis; and the first loop unit and the third loop unit are so connected that the directions of currents resulting from increases in magnetic fluxes in the same direction are in mutually reverse directions.

It is preferable for the central coil and the first coil to be partly overlapped to each other in the axial direction and the central coil and the second coil to be partly overlapped each other in the axial direction.

It is preferable for the first coil and the second coil to be equal in size to each other and disposed in mutually symmetric positions with respect to the central coil.

It is preferable for the first loop unit and the second loop unit to be so connected that the directions of currents resulting from increases in magnetic fluxes in the same direction are in the same direction, and for the third loop unit and the fourth loop unit to be so connected that the directions of currents resulting from increases in magnetic fluxes in the same direction are in the same direction.

It is preferable for the first coil and second coil to be saddle coils each defining a substantially cylindrical imaging area, and for each of the first loop unit, the second loop unit, the third loop unit and the fourth loop unit to have a loop formed of two arciform routes extending around the axis and two mutually parallel linear routes parallel to the axial direction.

An RF coil according to a second aspect of the invention is provided with a first coil having a first loop unit and a second loop unit opposed to each other with the prescribed axis of a subject in-between; a second coil disposed in a different position from the first coil in the direction of the axis and having a third loop unit and a fourth loop unit opposed to each other with the axis in-between, wherein the first loop unit and the third loop unit are arranged on mutually reverse sides with respect to the axis; the second loop unit and the fourth loop unit are arranged on mutually reverse sides with respect to the axis; the first loop unit and the second loop unit are so connected that the directions of currents resulting from increases in magnetic fluxes in the same direction are in the same direction; the third loop unit and the fourth loop unit are so connected that the directions of currents resulting from increases in magnetic fluxes in the same direction are in the same direction; and the first loop unit and the third loop unit are so connected that the directions of currents resulting from increases in magnetic fluxes in the same direction are in mutually reverse directions.

An RF coil according to a third aspect of the invention is provided with a central coil surrounding a subject around a prescribed axis; a first coil disposed toward one end of the central coil in the direction of the axis; and a second coil disposed toward the other end of the central coil in the direction of the axis and so connected to the first coil that the directions of currents resulting from increases in magnetic fluxes in the same direction are in the reverse direction to the first coil.

A magnetic resonance imaging apparatus according to a fourth aspect of the invention is provided with a magnetostatic field forming unit which forms a magnetostatic field; a gradient magnetic field forming unit which forms a gradient magnetic field; a central coil which forms a high frequency magnetic field in a subject within the magnetostatic field and receives magnetic resonance signals from the subject; a first coil and a second coil which receive magnetic resonance signals from the subject; and an image forming unit which forms tomographic images of the subject on the basis of the magnetic resonance signals received by the central coil, the first coil and the second coil, wherein the central coil is so disposed as to surround the subject around a prescribed axis; the first coil is disposed toward one end of the central coil in the direction of the axis and has a first loop unit and a second loop unit opposed to each other with the axis in-between; the second coil is disposed toward the other end of the central coil in the direction of the axis and has a third loop unit and a fourth loop unit opposed to each other with the axis in-between; the first loop unit and the third loop unit are arranged on mutually reverse sides with respect to the axis; the second loop unit and the fourth loop unit are arranged on mutually reverse sides with respect to the axis; and the first loop unit and the third loop unit are so connected that the directions of currents resulting from increases in magnetic fluxes in the same direction are in mutually reverse directions.

It is preferable for the image forming unit to form the tomographic images by subjecting to phased array synthesis data values which are based on the magnetic resonance signals received by the central coil, the first coil and the second coil.

According to the invention, it is possible to provide an RF coil and a magnetic resonance imaging apparatus which can restrain coupling while enhancing the freedom of design and arrangement of coils.

Further objects and advantages of the present invention will be apparent from the following description of the preferred embodiments of the invention as illustrated in the accompanying drawings.

BRIEF DESCRIPTION OF THE DRAWINGS

FIG. 1 is a block diagram showing the configuration of a magnetic resonance imaging apparatus in the foregoing mode for carrying out the present invention.

DETAILED DESCRIPTION OF THE INVENTION

Figure 2A:
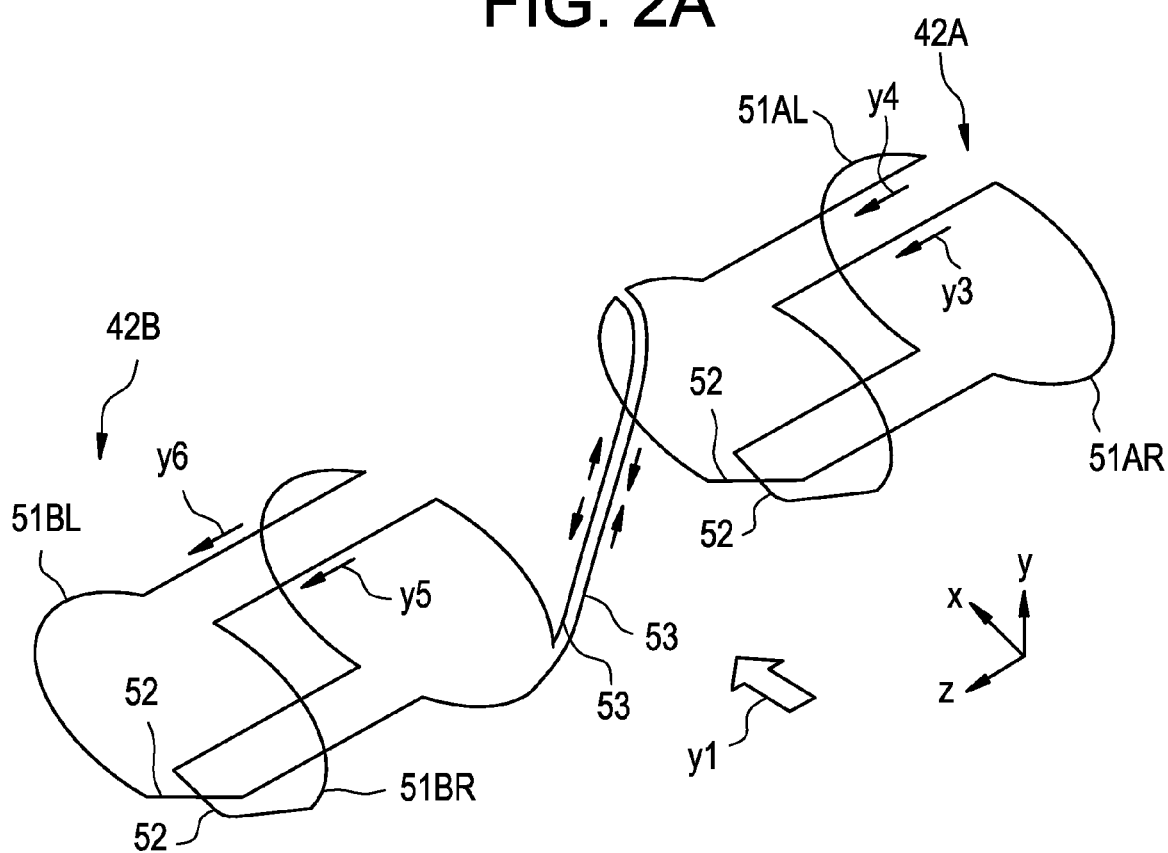
FIGS. 2a and 2b are schematic diagrams showing the configuration of auxiliary coils to the RF coil in the magnetic resonance imaging apparatus of FIG. 1.

FIG. 1 is a block diagram showing a schematic configuration of a magnetic resonance imaging apparatus (MRI) in this mode for carrying out the present invention. The magnetic resonance imaging apparatus has a magnetostatic field magnet unit 12, a gradient coil unit 13, an RF coil unit 14, an RF drive unit 22, a gradient drive unit 23, a data collecting unit 24, a control unit 25, a cradle 26, a data processing unit 31, an operation unit 32 and a display unit 33. Incidentally in FIG. 1, the magnetostatic field magnet unit 12 and the gradient coil unit 13 are schematically illustrated in a sectional view, while the RF coil unit 14 is schematically illustrated in a profile.

The magnetostatic field magnet unit 12 is provided to form a magnetostatic field in an imaging space B in which the subject is to be accommodated. The magnetostatic field magnet unit 12 is formed of a pair of permanent magnets. The magnetostatic field magnet unit 12 is so configured that the direction of the magnetostatic field is along a direction Z orthogonal to the direction of the body axis of the subject SU. Incidentally, the magnetostatic field magnet unit 12 may as well be configured of a superconducting magnet.

The gradient coil unit 13 forms a gradient magnetic field in the imaging space B in which a magnetostatic field is formed, and adds positional information to magnetic resonance signals received by the RF coil unit 14. The gradient coil unit 13 has three lines including a first gradient coil unit constituting a frequency encoding gradient magnetic field, a second gradient coil unit constituting a phase encoding gradient magnetic field, and a third gradient coil unit constituting a slice selecting gradient magnetic field.

The RF coil unit 14 forms a high frequency magnetic field by transmitting an RF pulse, which is an electromagnetic wave, to the subject in the imaging space B in which a magnetostatic field is formed by the magnetostatic field magnet unit 12, and excites the spins of protons in the imaging areas of the subject SU. The RF coil unit 14 receives as magnetic resonance signals the electromagnetic wave generates from those excited protons in the subject SU.

The RF coil unit 14, configured as a body coil is provided with a central coil 41, auxiliary coils (a first coil and a second coil) 42A and 42B. In the following description, a suffix sign A will be added to any constituent element pertaining to the auxiliary coil 42A, a suffix sign B, to any constituent element pertaining to the auxiliary coil 42B, and the suffix sign A or B will be dispensed with where there is no need to distinguish between the two to refer to such an element as, for instance, simply auxiliary coils 42.

The central coil 41 is configured of a volume coil surrounding the subject SU around its body axis (in the z-axis direction). The central coil 41 is, for instance, a bird cage type coil or a saddle type coil. Incidentally, the central coil 41 both transmits and receives RF signals. To add, the central coil 41 may be either embedded in a gantry, not shown, or appropriately installed in the imaging space B within a gantry.

The auxiliary coils 42 are configured of volume coils surrounding the subject SU around its body axis, and set smaller than the central coil 41 in size in the z-axis direction. The auxiliary coils 42 are disposed as RF coils dedicated to reception use. The auxiliary coil 42A is disposed toward one end of the central coil 41 in the direction of the body axis of the subject SU, while the auxiliary coil 42B is disposed toward the other end of the central coil 41 in the direction of the body axis of the subject SU. The auxiliary coil 42A and the auxiliary coil 42B are so disposed as to partly overlap the central coil 41 in the direction of the body axis of the subject. The relative positions of the central coil 41 and the auxiliary coil 42A and the relative positions of the central coil 42 and the auxiliary coil 42B are so set as to be symmetric with the center of the central coil 41 as the point of symmetry. Therefore, for instance, the overlapping area of the central coil 41 and the auxiliary coil 42A and the overlapping area of the central coil 41 and the auxiliary coil 42B are equal. Incidentally, the auxiliary coil 42A may be either embedded in a gantry, not shown, or appropriately installed in the imaging space B within a gantry.

The RF drive unit 22 has, in order to form a high frequency magnetic field within the imaging space B by driving the central coil 41 of the RF coil unit 14, a gate modulator (not shown), an RF power amplifier (not shown) and an RF oscillator (not shown). The RF drive unit 22, in accordance with a control signal from the control unit 25, modulates RF signals from the RF oscillator into signals of a prescribed timing and a prescribed enveloped by using the gate modulator. It outputs the RF signals modulated by the gate modulator, after amplifying them with the RF power amplifier, to the central coil 41.

The gradient drive unit 23, in accordance with a control signal from the control unit 25, drives the gradient coil unit 13 by applying a gradient pulse, and generates a gradient magnetic field in the imaging space B within which a magnetostatic field is formed. The gradient drive unit 23 has three lines of drive circuits (not shown) respectively corresponding to the three lines of gradient coil units 13.

The data collecting unit 24, in accordance with a control signal from the control unit 25, collects magnetic resonance signals received by the central coil 41 and the auxiliary coils 42 of the RF coil unit 14, and outputs them to the data processing unit 31. The data collecting unit 24 so collects the magnetic resonance signals having undergone phase encoding and frequency encoding as to match the space k. In the data collecting unit 24 here, after a phase-detector has phase-detected the magnetic resonance signals received by the RF coil unit 14 with the output of the RF oscillator of the RF drive unit 22 as reference signals, an A/D converter converts the magnetic resonance signals, which are analog signals, into digital signals. The collected magnetic resonance signals, after being stored into a memory, are outputted to the data processing unit 31.

The control unit 25 has a computer and a program to cause the functions of different parts of the computer to be so performed as to follow a prescribed pulse sequence. The control unit 25, in accordance with operation signals inputted from the operation unit 32 via the data processing unit 31, performs control by outputting control signals which cause the RF drive unit 22, the gradient drive unit 23 and the data collecting unit 24 to execute respectively prescribed pulse sequences.

The cradle 26 is a table on which the subject SU is to be mounted. The cradle unit 26 moves between the inside and outside of the imaging space B in accordance with a control signal from the control unit 25.

The data processing unit 31 has a computer and a program to cause the computer to perform prescribed data processing. The data processing unit 31, connected to the operation unit 32, receives inputs of operation signals from the operation unit 32. The data processing unit 31, connected to the control unit 25, outputs to the control unit 25 operation signals inputted by an operator to the operation unit 32. The data processing unit 31, also connected to the data collecting unit 24, acquires magnetic resonance signals collected by the data collecting unit 24, and subjects the acquired magnetic resonance signals to image processing to generate an image regarding a slice of the subject. And the data processing unit 31 outputs the generated image to the display unit 33.

The operation unit 32 is composed of operating devices such as a keyboard and a mouse. The operation unit 32, operated by an operator, outputs operation signals according to his operations to the data processing unit 31.

The display unit 33 is composed of a display device such as a CRT. The display unit 33 displays an image regarding a slice of the subject generated on the basis of magnetic resonance signals from the subject SU.

Figure 2B:
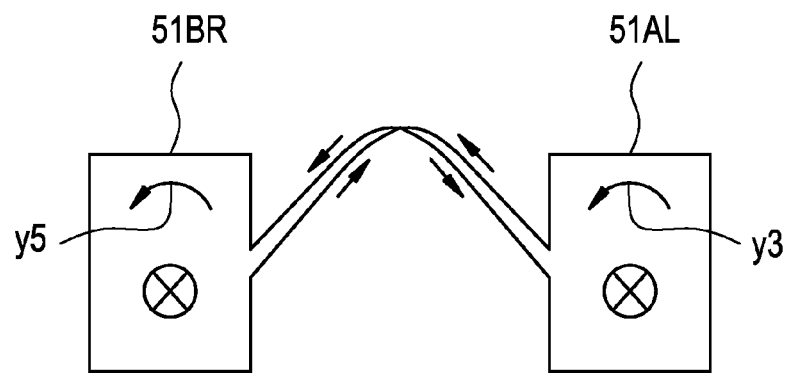

FIG. 2 (*a*) is a perspective view showing the auxiliary coils 42 of the magnetic resonance imaging apparatus 1, and FIG. 2 (*b*), a profile showing the auxiliary coils 42 in a partly abridged way.

The auxiliary coils 42 are composed of saddle coils. More specifically, the auxiliary coil 42A is provided with a loop unit 51AR and a loop unit 51AL opposed to each other with the body axis (parallel to the z-axis direction) of the subject SU in-between, while the auxiliary coil 42B is provided with a loop unit 51BR and a loop unit 51BL with the body axis of the subject SU in-between. In the following description, a suffix sign R will be added to any constituent element pertaining to the loop units 51R, a suffix sign L, to any constituent element pertaining to the loop units 51L, and the suffix sign L or R will be dispensed with where there is no need to distinguish between the two to refer to such an element as, for instance, simply a loop unit 51.

The loop units 51AR, 51AL, 51BR and 51BL are formed in the same size and shape among one another. More specifically, in each of the loop units 51, a loop is formed of two arciform routes extending around the body axis and two mutually parallel linear routes parallel to the body axis, and a substantially cylindrical imaging area is formed of the loop units 51R and the loop units 51L.

The loop units 51R and the loop units 51L are connected to each other by connecting units 52. The connecting units 52 are disposed to connect the loop units 51R and the loop units 51L in series as it were, and one connecting unit 52 and the other connecting unit 52 are so disposed as to cross each other. Therefore, when magnetic fluxes in the same direction increase (or decrease) in the loop units 51R and 51L, induced currents flow in the same direction.

When, for instance, magnetic fluxes in the direction indicated by arrow y1 increase in the auxiliary coil 42B, induced currents flow in the direction indicated by arrow y5 in the loop unit 51BR and in the direction indicated by arrow y6 in the loop unit 51BL. Supposing the absence of connecting units 53 to be described afterwards, following the line of the coil in the direction of arrow y5 in the order of the loop unit 51BR, the connecting units 52 and the loop unit 51BL will reveal that the direction of arrow y5 coincides with that of arrow y6. Further, when magnetic fluxes in the direction indicated by arrow y1 increase in the auxiliary coil 42A, induced currents flow in the direction indicated by arrow v3 in the loop unit 51AR and in the direction indicated by arrow y4 in the loop unit 51AL. Again supposing the absence of connecting units 53, following the line of the coil in the direction of arrow y3 in the order of the loop unit 51AR, the connecting units 52 and the loop unit 51AL will reveal that the direction of arrow y3 coincides with that of y4.

Incidentally, it is also possible to connect the loop units 51R and 51L in parallel. In this case, for instance, one connecting unit 52 and the other connecting unit 52 are prevented from crossing each other, and a capacitor is connected between one connecting unit 52 and the other connecting unit 52 to have signals outputted from both ends of the capacitor.

The auxiliary coil 42A and the auxiliary coil 42B are so connected by the connecting units 53 as to constitute a single closed loop. Before describing the method of connecting the auxiliary coil 42A and the auxiliary coil 42B, the method of connecting the auxiliary coil 42'A and the auxiliary coil 42'B in the comparative example will be described.

Figure 3A:
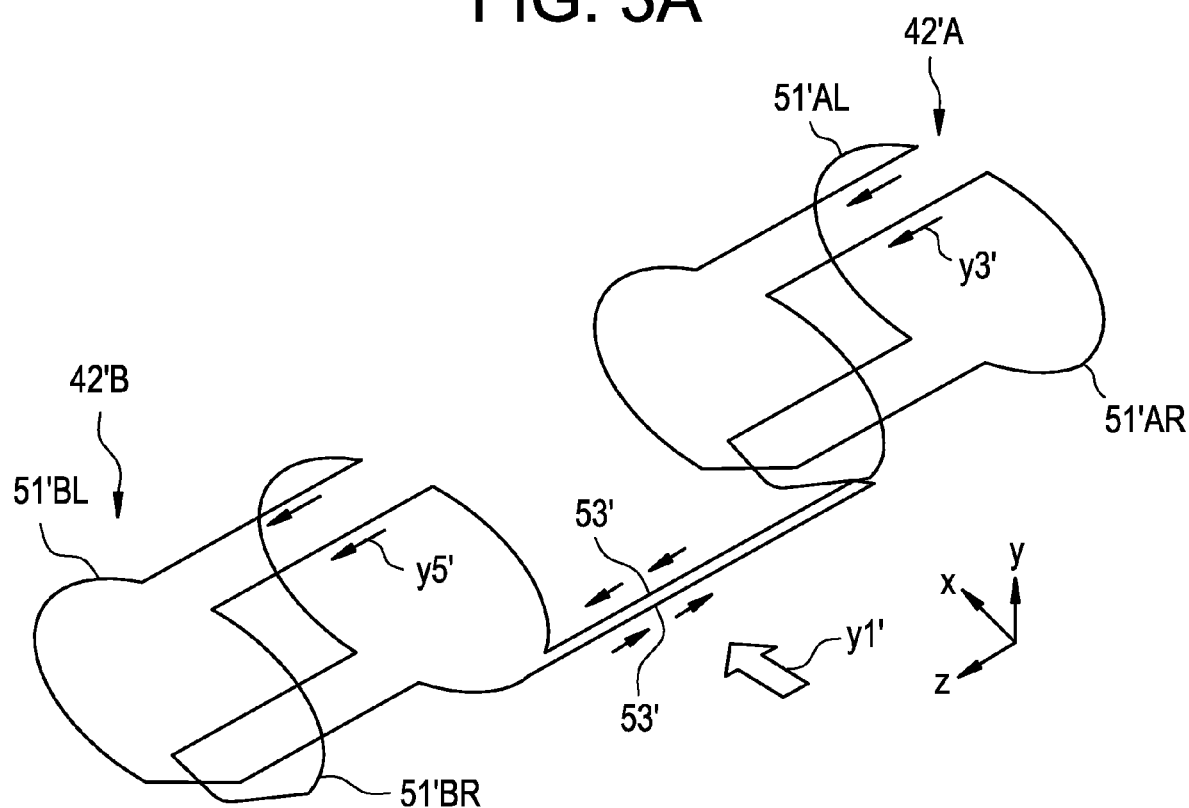
FIGS. 3a and 3b are schematic diagrams showing auxiliary coils in the comparative example.
Figure 3B:
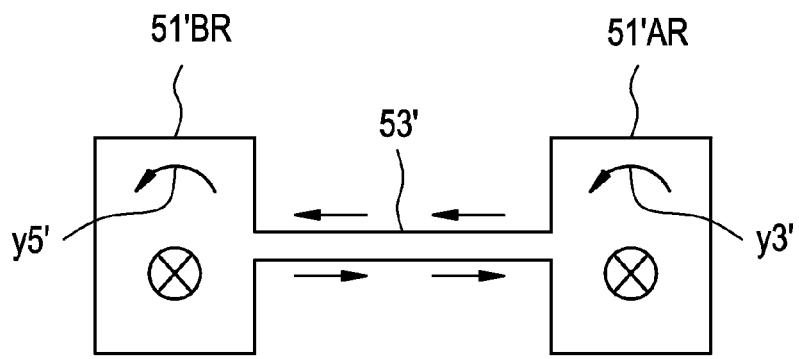

FIG. 3 (*a*) is a perspective view showing the auxiliary coils 42' in the comparative example and FIG. 3 (*b*), a profile showing part of the auxiliary coils 42'.

The auxiliary coil 42'A and the auxiliary coil 42'B are so connected by connecting units 53' as to constitute a single closed loop. The connecting units 53' are so disposed as to linearly link mutually opposed positions of the auxiliary coil 42'A and the auxiliary coil 42'B. For instance, a loop unit 51'AR and a loop unit 51'BR are connected, and the connecting units 53' connecting the loop unit 51'AR and the loop unit 51'BR are parallel to, and do not cross, each other.

Thus, the auxiliary coil 42'A and the auxiliary coil 42'B are so connected that, when magnetic fluxes in the same direction increase, induced currents flow in the same direction. For instance, when magnetic fluxes in the direction of arrow y1' increase, induced currents flow in the direction indicated by arrow y3' in the loop unit 51'AR and in the direction indicated by arrow y5' in the loop unit 51'BR. Following the line of the coil in the direction of arrow y3' in the order of the loop unit 51'AR, the connecting units 53' and the loop unit 51'BR will reveal that the direction of arrow y3' coincides with that of arrow y5'.

On the other hand, the auxiliary coil 42A and the auxiliary coil 42B shown in FIG. 2 (*a*) and FIG. 2 (*b*) are so connected that, as it were, the auxiliary coil 42'A and the auxiliary coil 42'B were rotated by as much as 180 degrees in relative terms around the body axis (around the z axis) of the subject.

More specifically, the loop units 51 which are on the reverse sides to each other with respect to the body axis of the subject are connected. For instance, the loop unit 51AL and the loop unit 51BR are connected to each other.

The two connecting unit 53 extending to one of the loop units 51 are inverted upside down in the process of extending toward the other of the loop units 51, in other words one crosses the other, to be connected to the other of the loop units 51. In other words, the loop units 51 connected to each other by the connecting unit 53 are so connected that, when magnetic fluxes in the same direction increase, induced currents in the mutually reverse directions are generated and, eventually, the auxiliary coil 42A and the auxiliary coil 42B are so connected that, when magnetic fluxes in the same direction increase, induced currents in the mutually reverse directions are generated.

For instance, when magnetic fluxes in the direction indicated by arrow y1 increase, induced currents in the direction of arrow y4 are generated in the loop unit 51AL and induced currents in the direction of arrow y5, in the loop unit 51BR; following the line of the coil in the direction of arrow y4 in the order of the loop unit 51AL, the connecting unit 53 and the loop unit 51BR will reveal that the direction of arrow y4 coincides with that of arrow y5.

Therefore, and even if flowing of a current in the central coil 41 gives rise to magnetic fluxes and mutual induction causes currents to flow in the auxiliary coils 42, since the current generated in the auxiliary coil 42A and that generated in the auxiliary coil 42B cancel each other, the interference by the central coil 41 is restrained. Thus, isolation is maintained between the central coil 41 and the auxiliary coils 42.

Incidentally, the connection positions of the connecting units 53 to the loop units 51, that of the connecting units 53 between the loop units 51 and the relative position of one of the connecting unit 53 to the other may be set appropriately as desired. It is to be noted that they should be arranged in the surroundings of the imaging area in order not to narrow the imaging area within the central coil 41. So that no coupling may arise between the connecting units 53 and the central coil 41 or the like, it is desirable for the distance between the two connecting units 53 extending from one loop unit 51 to be relatively short, for instance shorter than the width of the auxiliary coils 42.

Figure 4:
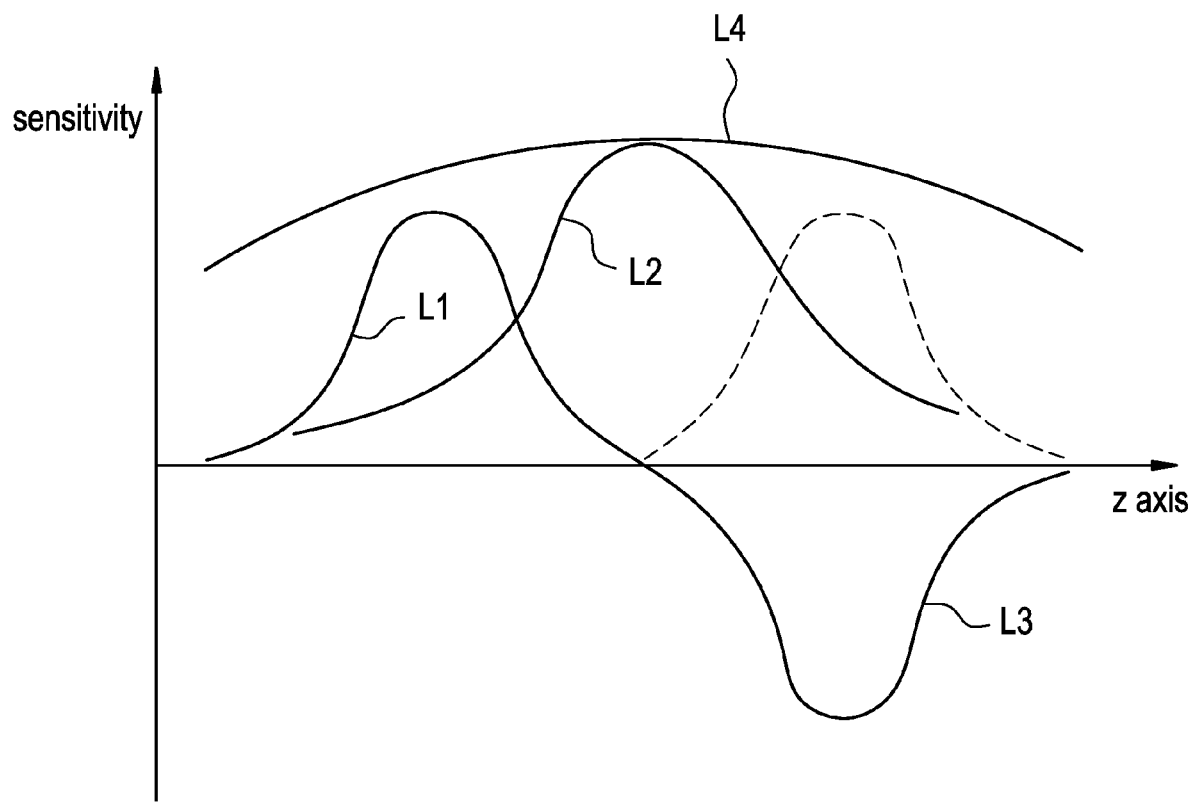
FIG. 4 is a diagram showing the sensitivity distributions in the magnetic resonance imaging apparatus of FIG. 1.

FIG. 4 is a diagram showing the sensitivity distributions of the RF coil unit 14. In FIG. 4, the horizontal axis represents the direction of the body axis (the direction of the z-axis) of the subject, and the vertical axis, sensitivity in the direction of the x-axis or the direction of the y-axis. Curve L1 represents the sensitivity distribution of the auxiliary coil 42A, curve L2, the sensitivity distribution of the central coil 41 and curve L3, the sensitivity distribution of the auxiliary coil 42B. Incidentally, since the auxiliary coil 42A and the auxiliary coil 42B are rotated by 180 degrees in relative terms in the RF coil unit 14, the sensitivity of the auxiliary coil 42A and that of the auxiliary coil 42B are reverse to each other in polarity.

The sensitivity distribution of the central coil 41 is lower toward the end in the direction of the z-axis. Then, data based on RF signals received by the central coil 41 are compensated with RF signals received by the auxiliary coils 42 to maintain the sensitivity of the RF coil unit 14 over a relatively wide range in the direction of the z-axis as indicated by curve L4.

Compensation by the auxiliary coils 42 utilizes, for instance, phase array synthesis. By calculating data values based on RF signals received by the central coil 41 and the auxiliary coils 42, for instance the sum of squares of pixel values, an image resulting from synthesis of an image based on the central coil 41 and an image based on the auxiliary coils 42 is acquired. Incidentally, the SMASH method or the SENSE method may be applied as well.

In the mode for carrying out the invention described above, since the auxiliary coil 42A and the auxiliary coil 42B are so connected that the directions of currents arising from increases in magnetic fluxes in the same direction are reverse to each other, induced currents generated by the interference of the central coil 41 in the auxiliary coils 42 are cancelled between the auxiliary coil 42A and the auxiliary coil 42B. Therefore, the freedom of design is greater than where decoupling is accomplished by adjusting the distances between the central coil 41 and the auxiliary coils 42.

The auxiliary coils 42, intended to supplement the central coil 41, can be used as required. Therefore, for instance, by using only the central coil 41 for imaging at normal times, power consumption by the amplifier for amplifying signals of the RF coil and other elements can be restrained.

Also, as the auxiliary coil 42A and the auxiliary coil 42B are equal in size and disposed in symmetric positions with respect to the central coil 41, the quantities of interference on them by the central coil 41 tend to be equal, and this facilitates effective decoupling.

The present invention is not limited to the mode for carrying it out described above, but may be implemented in various other ways.

The central coil is not limited to a body coil. Anything that can be disposed between a first coil and a second coil can be used. Where the central coil is a volume coil, it needs only to surround an appropriate region of the subject, and may as well be, for instance, a head coil.

Figure 5A:
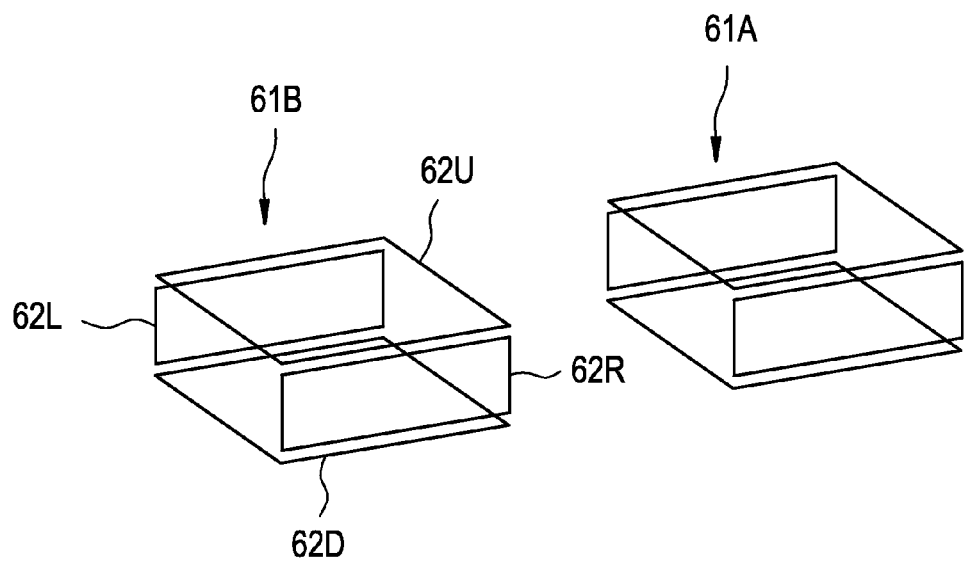
FIGS. 5a and 5b are diagrams showing a modified version of the auxiliary coils.
Figure 5B:
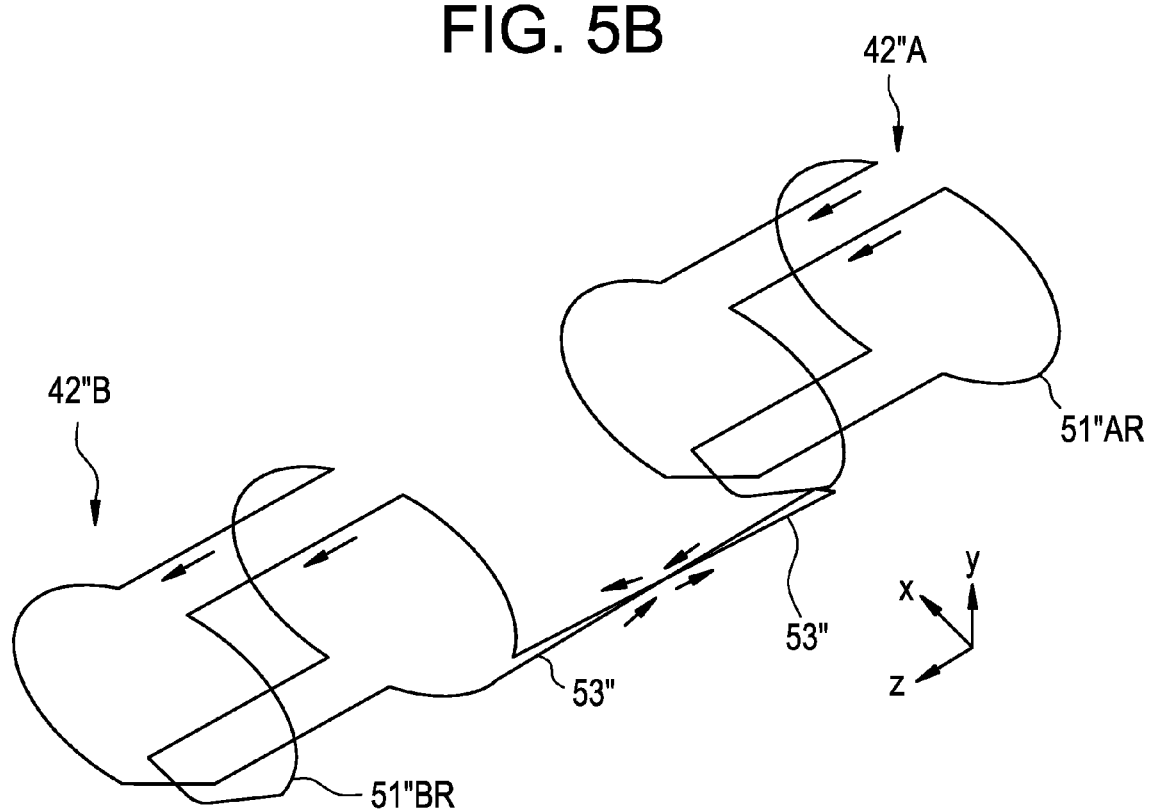

The first coil and the second coil need only to be arranged in different positions in the direction of a prescribed axis of the subject and be such that an increase in magnetic fluxes in one direction, for instance an increase in magnetic fluxes in a direction orthogonal to the axis, induces a current. Therefore, they are not limited to saddle coils consisting of a pair of loops. For instance, as shown in FIG. 5 (a), each of coils 61A and 61B as the first and second coils may be what includes two pairs of mutually orthogonal loop units 62R, 62L, 62U and 62D, and each of the loops 62 need not be curved.

The connection between the loop unit of the first coil and the loop unit of the second coil is not limited to what connects elements arranged on reverse sides to each other with the axis of the subject in-between (for instance the loop units 51AR and 51BL in the foregoing mode for implementation). If the connection results in reverse directions of the currents arising from increases in magnetic fluxes in the same direction, any loop unit of the first coil and any loop unit of the second coil may be connected to each other. For instance, as shown in FIG. 5 (b), loop units 51"AR and 51"BR of auxiliary coils 42"A and 42"B, respectively, may be connected on the same side with respect to the axis of the subject, so that connecting units 53" cross each other.

The central coil and the first coil or the second coil need not overlap each other. It is sufficient for signals received by the central coil to permit correction on the basis of signals received by the first coil and the second coil or the imaging area to permit expansion compared with the arrangement having only the central coil. For instance, the central coil and the first coil or the second coil may as well be arranged with no gap between them and without overlapping each other.

Further, the first coil and the second coil need not be equal in size or arranged in symmetric positions with respect to the central coil. This is because, if currents arising from interference by the central coil can cancel each other if only a little, an effect to restrain coupling can be considered to have been achieved.

Many widely different embodiments of the invention may be configured without departing from the spirit and the scope of the present invention. It should be understood that the present invention is not limited to the specific embodiments described in the specification, except as defined in the appended claims.

The invention claimed is:

1. An RF coil configured for a magnetic resonance imaging apparatus comprising:

a central coil surrounding a subject around a prescribed axis;

a first coil disposed toward a first end of said central coil in a direction of said axis and having a first loop unit and a second loop unit opposed to each other with said axis in-between; said first loop unit coupled in parallel to said second loop unit using a first connecting unit and a second connecting unit such that said first connecting unit and said second connecting unit do not cross paths; and a second coil disposed toward a second end of said central coil in the direction of said axis and having a third loop unit and a fourth loop unit opposed to each other with said axis in-between, said third loop unit coupled in parallel to said fourth loop unit using a third connecting unit and a fourth connecting unit such that said third connecting unit and said fourth connecting unit do not cross paths, wherein:

said first loop unit and said third loop unit are arranged on mutually reverse sides with respect to said axis;

said second loop unit and said fourth loop unit are arranged on mutually reverse sides with respect to said axis; and said first loop unit and said third loop unit are so connected that directions of currents resulting from increases in magnetic fluxes in the same direction are in mutually reverse directions.

2. An RE coil according to claim 1 wherein:

said central coil and said first coil are partly overlapped with each other in said axial direction; and said central coil and said second coil are partly overlapped with each other in said axial direction.

3. An RE coil according to claim 1 wherein said first coil and said second coil are equal in size to each other and disposed in mutually symmetric positions with respect to said central coil.

4. An RE according to claim 1 wherein:

said first loop unit and said second loop unit are so connected that the directions of currents resulting from increases in magnetic fluxes in the same direction are in the same direction; and said third loop unit and said fourth loop unit are so connected that the directions of currents resulting from increases in magnetic fluxes in the same direction are in the same direction.

5. An RE coil according to claim 1 wherein:

said first coil and second coil are saddle coils each defining a substantially cylindrical imaging area; and each of said first loop unit, said second loop unit, said third loop unit and said fourth loop unit comprises a loop formed of two arciform routes extending around said axis and two mutually parallel linear routes parallel to said axial direction.

6. An RF coil configured for a magnetic resonance imaging apparatus, said RF coil comprising:

a first coil comprising a first loop unit and a second loop unit opposed to each other with a prescribed axis of a subject in-between, said first loop unit coupled in parallel to said second loop unit using a first connecting unit and a second connecting unit such that said first connecting unit and said second connecting unit do not cross paths; and a second coil disposed in a different position from said first coil in a direction of said axis, said second coil comprising a third loop unit and a fourth loop unit opposed to each other with said axis in-between, said third loop unit coupled in parallel to said fourth loop unit using a third connecting unit and a fourth connecting unit such that said third connecting unit and said fourth connecting unit do not cross paths, wherein:

said first loop unit and said third loop unit are arranged on mutually reverse sides with respect to said axis;

said second loop unit and said fourth loop unit are arranged on mutually reverse sides with respect to said axis;

said first loop unit and said second loop unit are so connected that the directions of currents resulting from increases in magnetic fluxes in a first direction are in a second direction;

said third loop unit and said fourth loop unit are so connected that the directions of currents resulting from increases in magnetic fluxes in the first direction are in the second direction; and said first loop unit and said third loop unit are so connected that the directions of currents resulting from increases in magnetic fluxes in the same direction are in mutually reverse directions.

7. An RF coil according to claim 6 further comprising a central coil surrounding a subject around a prescribed axis.

8. An RE coil according to claim 6 wherein:

said central coil and said first coil are partly overlapped with each other in an axial direction; and said central coil and said second coil are partly overlapped with each other in an axial direction.

9. An RE coil according to claim 6 wherein said first coil and said second coil are equal in size to each other and disposed in mutually symmetric positions with respect to said central coil.

10. An RE coil according to claim 6 wherein:

said first coil and said second coil are saddle coils each defining a substantially cylindrical imaging area; and each of said first loop unit, said second loop unit, said third loop unit, and said fourth loop unit comprises a loop formed of two arciform routes extending around said axis and two mutually parallel linear routes parallel to said axial direction.

11. An RF coil configured for a magnetic resonance imaging apparatus, said RF coil comprising:

a central coil surrounding a subject around a prescribed axis;

a first coil disposed toward a first end of said central coil in a direction of said axis, said first coil comprising a first loop unit and a second loop unit, said first loop unit coupled in parallel to said second loop unit using a first connecting unit and a second connecting unit such that said first connecting unit and said second connecting unit do not cross paths; and a second coil disposed toward a second end of said central coil in the direction of said axis and so connected to said first coil that the directions of currents resulting from increases in magnetic fluxes in a same direction are in a reverse direction to said first coil, said second coil comprising a third loop, unit and a fourth loop trait, said third loop unit coupled in parallel to said fourth loop unit using a third connecting unit and a fourth connecting unit such that said third connecting unit and said fourth connecting unit do not cross paths.

12. An RF coil according to claim 11 wherein:

said first loop unit and said second loop unit are so connected that the directions of currents resulting from increases in magnetic fluxes in the same direction are in the same direction; and said central coil and said first coil are partly overlapped with each other in an axial direction.

13. An RF coil according to claim 11 wherein:
said third loop unit and said fourth loop unit are so connected that the directions of currents resulting from increases in magnetic fluxes in the same direction are in the same direction; and
said central coil and said second coil are partly overlapped with each other in an axial direction.

14. An RF coil according to claim 11 wherein:
said first coil and said second coil are equal in size to each other and disposed in mutually symmetric positions with respect to said central coil; and
said first coil and said second coil are saddle coils each defining a substantially cylindrical imaging area.

15. A magnetic resonance imaging apparatus comprising:
a magnetostatic field forming unit which forms a magnetostatic field;
a gradient magnetic field forming unit which forms a gradient magnetic field;
an RF coil configured for an MRI apparatus comprising:
  a central coil which forms a high frequency magnetic field in a subject within said magnetostatic field and receives RF magnetic resonance signals from said subject;
  a first coil and a second coil which receive magnetic resonance signals from said subject; and
an image forming unit which forms MRI tomographic images of the subject on the basis of the RF magnetic resonance signals received by said central coil, said first coil and said second coil, wherein:
said central coil is so disposed as to surround said subject around a prescribed axis;
said first coil is disposed toward a first end of said central coil in a direction of said axis and has a first loop unit and a second loop unit opposed to each other with said axis in-between, said first loop unit coupled in parallel to said second loop unit using a first connecting unit and a second connecting unit such that said first connecting unit and said second connecting unit do not cross paths;
said second coil is disposed toward a second end of said central coil in the direction of said axis and has a third loop unit and a fourth loop unit opposed to each other with said axis in-between; other with said axis in-between, said third loop unit coupled in parallel to said fourth loop unit using a third connecting unit and a fourth connecting unit such that said third connecting unit and said fourth connecting unit do not cross paths;
said first loop unit and said third loop unit are arranged on mutually reverse sides with respect to said axis;
said second loop unit and said fourth loop unit are arranged on mutually reverse sides with respect to said axis; and
said first loop unit and said third loop unit are so connected that the directions of currents resulting from increases in magnetic fluxes in the same direction are in mutually reverse directions.

16. A magnetic resonance imaging apparatus according to claim 15 wherein said image forming unit forms said tomographic images by subjecting data values to phased array synthesis, wherein the data values are based on the magnetic resonance signals received by said central coil, said first coil and said second coil.

17. A magnetic resonance imaging apparatus according to claim 15 wherein:
said central coil and said first coil are partly overlapped with each other in an axial direction; and
said central coil and said second coil are partly overlapped with each other in an axial direction.

18. A magnetic resonance imaging apparatus according to claim 15 wherein said first coil and said second coil are equal in size to each other and disposed in mutually symmetric positions with respect to said central coil.

19. A magnetic resonance imaging apparatus according to claim 15 wherein:
said first loop unit and said second loop unit are so connected that the directions of currents resulting from increases in magnetic fluxes in the same direction are in the same direction; and
said third loop unit and said fourth loop unit are so connected that the directions of currents resulting from increases in magnetic fluxes in the same direction are in the same direction.

20. A magnetic resonance imaging apparatus according to claim 15 wherein:
said first coil and said second coil are saddle coils each defining a substantially cylindrical imaging area; and
each of said first loop unit, said second loop unit, said third loop unit, and said fourth loop unit comprises a loop formed of two arciform routes extending around said axis and two mutually parallel linear routes parallel to said axial direction.

* * * * *